(12) United States Patent
Yang (10) Patent No.: US 7,508,933 B2
(45) Date of Patent: Mar. 24, 2009

(54) RESONANCE CHAMBER OF A CELLULAR PHONE

(75) Inventor: Tsung-Lung Yang, HsinChu (TW)

(73) Assignee: BenQ Corporation, Gueishan, Taoyuan (TW)

( * ) Notice: Subject to any disclaimer, the term of this patent is extended or adjusted under 35 U.S.C. 154(b) by 775 days.

(21) Appl. No.: 11/047,369

(22) Filed: Jan. 31, 2005

(65) Prior Publication Data

US 2005/0190941 A1  Sep. 1, 2005

(30) Foreign Application Priority Data

Feb. 3, 2004 (TW) ............... 93102417 A (51) Int. Cl.
*H04M 1/00* (2006.01)
*H04M 9/00* (2006.01)
*H04R 1/02* (2006.01)
*H04R 1/20* (2006.01)

(52) U.S. Cl. ................. 379/433.02; 381/338; 381/345; 381/349

(58) Field of Classification Search ............ 379/433.01, 379/433.02; 381/337, 338, 345, 347, 348, 381/349, 350, 351, 371, 372; 181/155, 156, 181/145

See application file for complete search history.

(56) References Cited

U.S. PATENT DOCUMENTS 6,389,145 B2 *  5/2002  Baumhauer et al. ......... 381/345

FOREIGN PATENT DOCUMENTS

| CN | 1322455 | 11/2001 |
|---|---|---|
| CN | 1420636 | 5/2003 |
| EP | 1 389 032 | 2/2004 |

OTHER PUBLICATIONS

English abstract from corresponding document WO 0021330 for CN 1322455 dated Nov. 14, 2001.

English abstract from corresponding document EP 1294051 for CN 1420636 date May 28, 2003.

* cited by examiner

*Primary Examiner*—Curtis Kuntz
*Assistant Examiner*—Tuan D Nguyen (57) ABSTRACT

A cellular phone having a first opening for delivering voice on a shell is provided. A printed circuit board (PCB) is disposed within an inner space enclosed by the shell and divides the inner space into a first acoustic room and a second acoustic room. A speaker is disposed within the first acoustic room and electrically connects the PCB. A through hole is formed on the PCB to communicate the first acoustic room and the second acoustic room to increase the size of total resonance chamber for improving resonance effect in low frequency voices. Furthermore, at least a second opening is formed on the shell to communicate the first acoustic room or the second acoustic room to the environment for flattening the resonance curve to improve the voice quality.

22 Claims, 6 Drawing Sheets

RESONANCE CHAMBER OF A CELLULAR PHONE

BACKGROUND OF THE INVENTION

1. Field of the Invention

This invention relates to a resonance chamber of a cellular phone, and more particularly to a resonance chamber with an improved resonance effect in low frequency voices and a flattened resonance curve.

2. Description of Related Art

As a vigorous development in telecommunication industry, the demand for cellular phones has been massively increased. The cellular phone utilizes electric-acoustic transducers, such as transmitters and speakers, to transform electric signals into mechanical vibrations so as to animate acoustic messages, or to transform acoustic messages into electric signals for telecommunication purposes. The speaker is one of the most popular electric-acoustic transducers, and it is a mechanical design that can enable an input electric signal to transform into an acoustic message. Basically, according to different operation theories, the speakers nowadays can be separated into three categories: a moving-coil type, an electrostatic type, and a piezoelectric type.

In addition, as the cellular phone becomes slimmer in order to improve portability, the size of the speaker inside the cellular phone should be definitely reduced as well, and so is the inner space of the cellular phone. In the inner space of the cellular phone, a resonance chamber is particularly form to generate acoustic messages.

Figure 1:
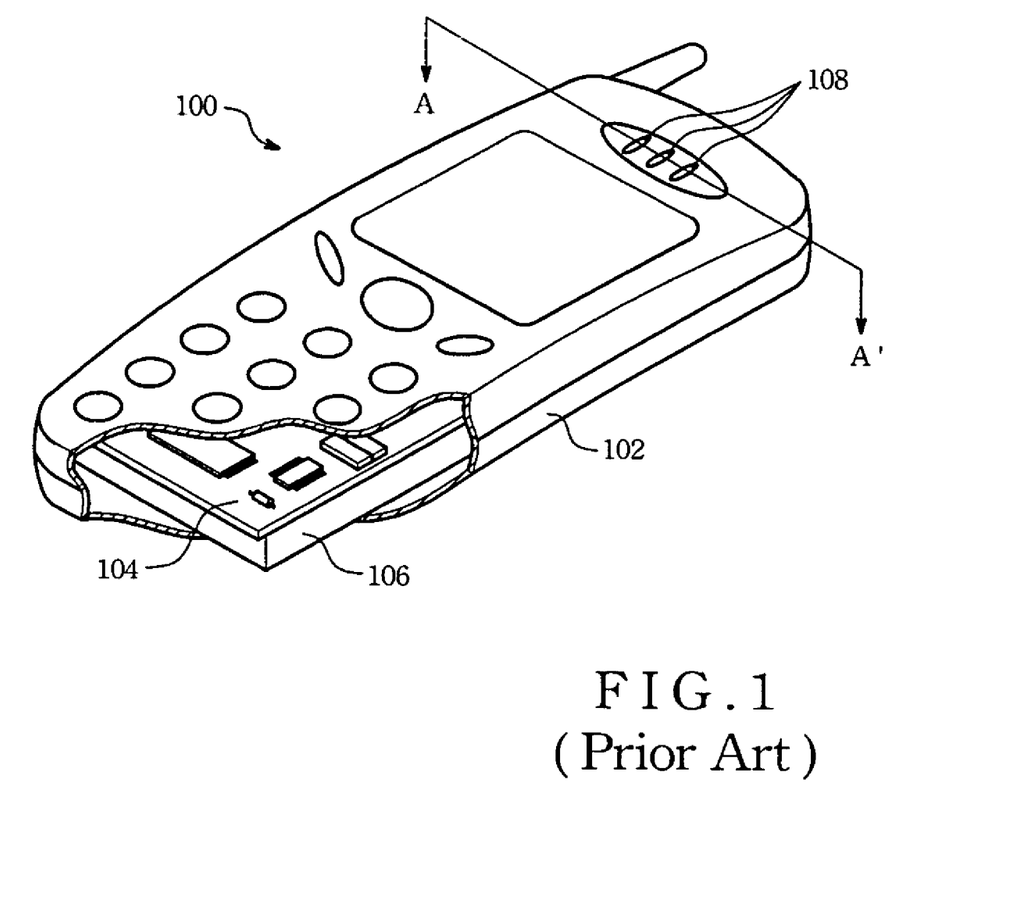
FIG. 1 depicts a schematic view of a traditional cellular phone.
Figure 2:
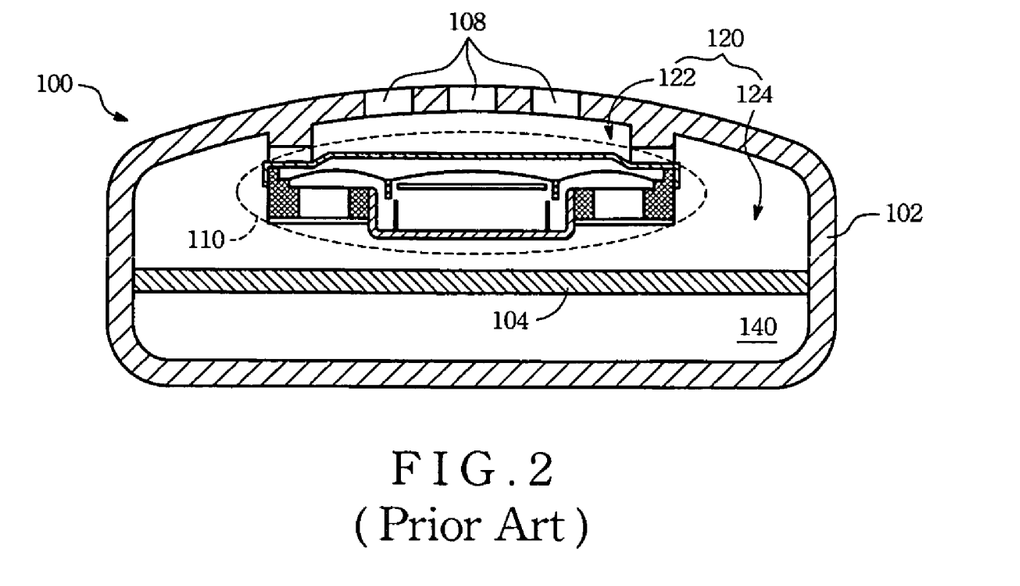
FIG. 2 depicts a schematic cross-section view along line A-A' of FIG. 1.

FIG. 1 shows a traditional cellular phone 100 having a printed circuit board (PCB) 104 housed by a shell 102 of the cellular phone 100. A displaying panel, an input device (such as a touch panel or a mini keyboard), a speaker, and a transmitter are placed in front of the PCB 104, while a battery 106 is placed behind the PCB 104. Referring to FIG. 2, which shows a cross-section view reference to A-A' of FIG. 1, the inner space of the cellular phone 100 is divided into a first acoustic room 120 and a second acoustic room 140 by the PCB 104. The speaker 110, which is placed just behind openings 108 on the shell 102, further divides the first acoustic room 120 into a front space 122 and a rear space 124. The front space 122 and the rear space 124 are both used as resonance chambers for the speaker 110 to generate acoustic messages conveying outward through the openings 108 on the shell 102.

Figure 3:
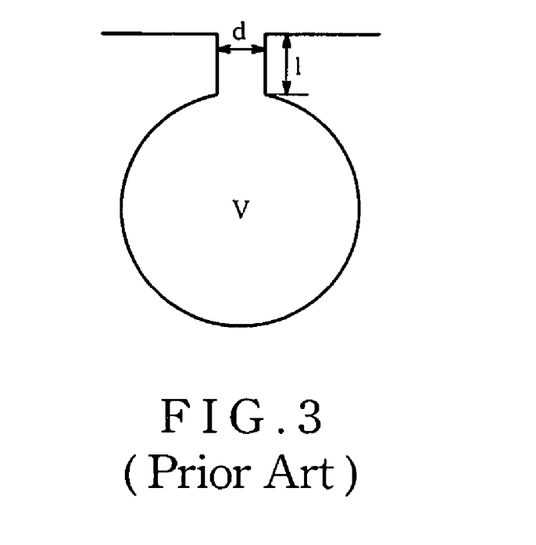
FIG. 3 depicts a schematic view of a typical Helmholtz resonance chamber.

FIG. 3 shows a typical Helmholtz resonance chamber, which is widely applied to simulate frequency responses of a speaker system. As shown, the Helmholtz resonance chamber is a rigid-wall cavity with a narrow, short neck portion to connect to the environment. If the diameter and length of the neck portion is much smaller than the wavelength of an acoustic wave, the air inside the neck portion can be regarded as a massive block. Moreover, for the volume inside the chamber is much larger than that in the neck portion, the air inside the chamber presents a quasi spring-and-damper structure. Thus, when the frequency of an acoustic wave equals to the natural frequency of the chamber, the quasi massive-block (i.e. the air in the neck portion) inside the neck portion would be actuated to vibrate in a predetermined pattern. The actuated quasi massive-block would simultaneously rub the sidewall of the neck portion so as to damp down the dynamical motion thereof. Definitely, during the vibration described above, a respective sound is generated.

According to a calculation of Temkin in 1936, a vibration frequency of a Helmholtz resonance chamber is defined as:

$$f = \frac{c}{2\pi}\sqrt{\frac{s}{Vl'}} \quad (1)$$

In which c stands for the speed of the sound in meters per second, s stands for the opening size of the neck portion in square meters; V stands for the volume of the resonance chamber in cubic meters; and l' stands for an effective length in meters. In the case that the cross section of the neck portion is circular, l'=l+0.8 d, in which l is the length of the neck portion in meters and d is a diameter of the cross section in meters. It is clearly that, as the size of the resonance chamber increases, the effective resonance frequency would be lowered down.

As mentioned, the cellular phone 100 of FIG. 2 has a resonance chamber positioned in front of the PCB 104, and the size of the resonance chamber is restricted mainly by the size of the cellular phone 100. Therefore, as the cellular phone becomes slimmer, the resonance effect of low frequency voices would be worse due to a smaller resonance chamber. On the other hand, an increase in the size of the resonance chamber may result in a larger cellular phone and sacrifice the portability of the cellular phone.

Accordingly, how to enlarge the resonance chamber without changing the size of the cellular phone has become an important issue in improving voice quality of the cellular phone.

SUMMARY OF THE INVENTION

A main object of the present invention is to provide a cellular phone with a shell having a first opening formed thereon. A circuit board is disposed within an inner space enclosed by the shell and further divided into a first acoustic room and a second acoustic room. A speaker is disposed within the first acoustic room and electrically connects to the circuit board. In addition, a through hole is formed in the circuit board to communicate the first acoustic room and the second acoustic room so as to form an enlarged integral resonance chamber to improve resonance effect of low frequency voices.

A second object of the present invention is to provide a cellular phone with a second opening on the shell to communicate the first acoustic room or the second acoustic room to the environment.

In an embodiment of the present invention, the speaker is assembled behind the first opening, and the through hole is formed behind the speaker.

In an embodiment of the present invention, the through hole is aligned to a center of the speaker.

In an embodiment of the present invention, the second opening is formed on the sidewall of the inner space for communicating the first acoustic room to the environment.

In an embodiment of the present invention, the first acoustic room connects to the second acoustic room through the through hole, and the second opening is formed on the sidewall of the inner space for communicating the second acoustic room to the environment.

Reference will now be made in detail to the preferred embodiments of the present invention, examples of which are illustrated in the accompanying drawings. Wherever possible, the same reference numbers will be used throughout the drawings to refer to the same or like parts.

BRIEF DESCRIPTION OF THE DRAWINGS

The present invention will now be specified with reference to its preferred embodiments illustrated in the drawings, in which.

DETAIL DESCRIPTION OF THE PREFERRED EMBODIMENTS

The invention disclosed herein is directed to a cellular phone with an inner space as a resonance chamber. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 4:
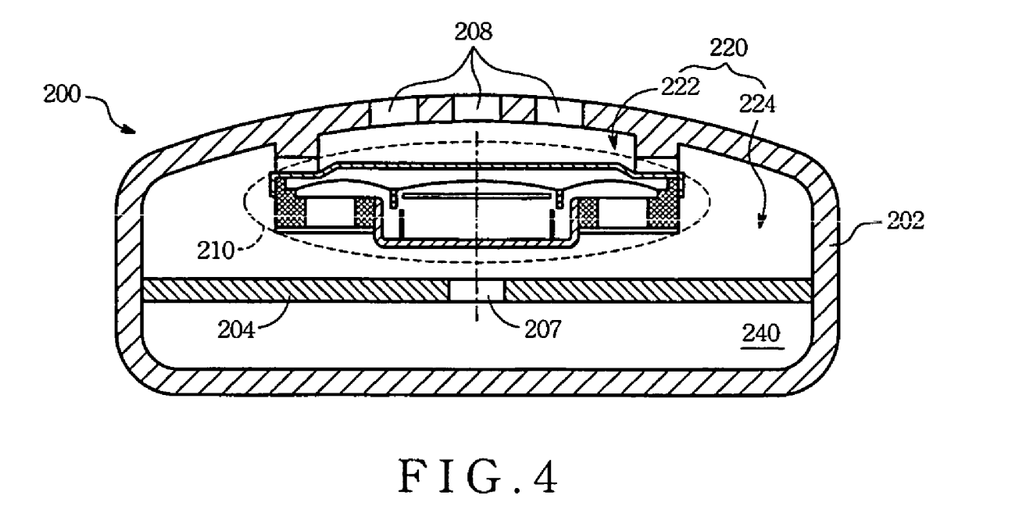
FIG. 4 depicts a schematic view of a first embodiment of the cellular phone in accordance with the present invention.

FIG. 4 is a cross-section view of a first embodiment of the cellular phone 200 in accordance with the present invention. A shell 202 of the cellular phone 200 encloses an inner space and has at least a first opening 208 (three shown in the figure) with a size ranged from 1 mm$^2$ to 100 mm$^2$ is formed on a front portion of the shell 202 to communicate the inner space 220 to the environment. A circuit board 204 is disposed within the inner space and further divides the inner space into a first acoustic room 220 and a second acoustic room 240. A voice generator 210, for example a speaker, is disposed within the first acoustic room 220 and further divides the first acoustic room 220 into a front space 222 and a rear space 224. The voice generator 210 also electrically connects to the circuit board 204 to access controlling signals and a power supply. In addition, a through hole 207, which is aligned to a center of the voice generator 210, is formed in the circuit board 204 to communicate the first acoustic room 220 and the second acoustic room 240 so as to form an enlarged integral resonance chamber for improving resonance effect of low frequency voices.

Figure 5:
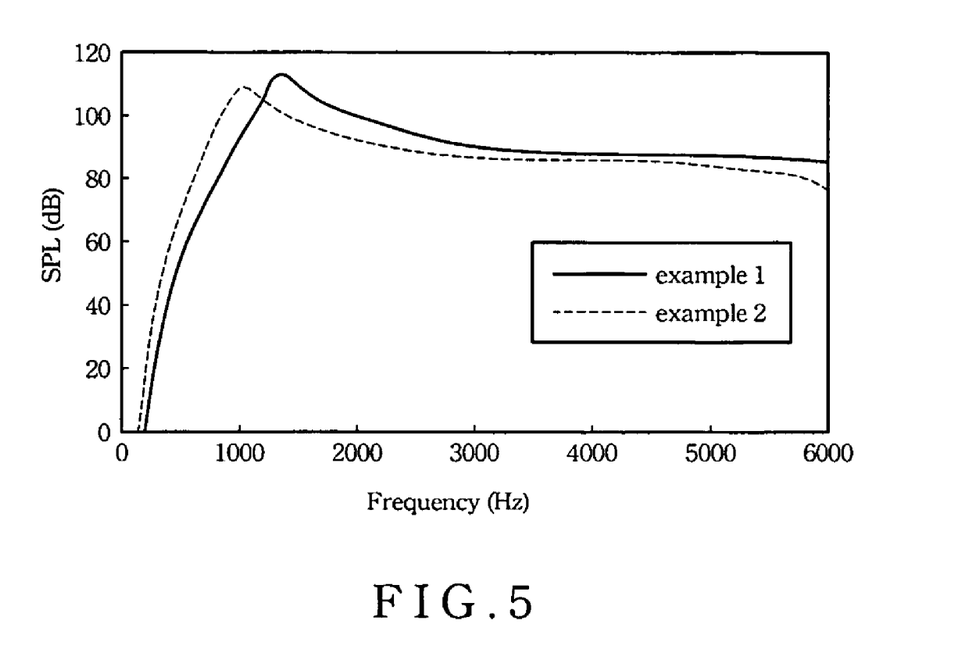
FIG. 5 shows simulation results of resonance curves of the cellular phone of FIG. 2 and FIG. 4.

FIG. 5 shows frequency resonance curves (or say, frequency response curves) calculated according to the simulation results of the cellular phone 100 of FIG. 2 (denoted as example 1) and the cellular phone 200 of FIG. 4 (denoted as example 2). The solid-lined resonance curve of the cellular phone 100 of FIG. 2 is calculated by given a 40 mm$^2$ first opening 108, a 19 mm-diameter speaker 110, a 1.15 ml front space 122, a 2.04 ml rear space 124, a 1 mm thick circuit board 104, and a 1 mm thick shell 102. The dash-lined resonance curve of the cellular phone 200 of FIG. 4 is calculated by given a 40 mm$^2$ first opening 208, a 19 mm-diameter speaker 210, a 1.15 ml front space 222, a 2.04 ml rear space 224, a 1 mm thick circuit board 204, a 1 mm thick shell 202, a 240 mm$^2$ through hole 207, and a 2.02 ml second acoustic room 240.

It is noted that the resonance curve of the example 2 has a peak, which implies the resonance frequency, located in a lower frequency region with respect to that of the example 1. Thus, the introducing of the through hole 207 for communicating the first acoustic room 220 and the second acoustic room 240 has a substantial effect in lowering the resonance frequency. It is to say that the addition of the through hole 207 does improve the resonance effect in low frequency voices.

However, even with a through hole 207 in the circuit board 204, the resonance curve of FIG. 5 still represents severely vibration magnitudes near the resonance frequency. Thus, the vibration formed by the speaker with frequencies close to the resonance frequency may result in a shrill voice that can degrade the voice quality.

Figure 6:
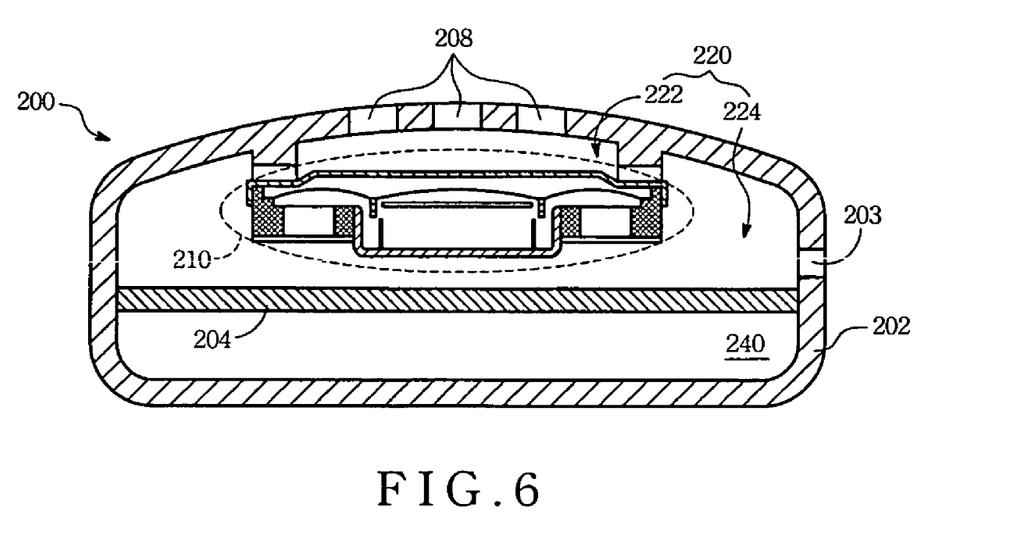
FIG. 6 depicts a schematic view of a second embodiment of the cellular phone in accordance with the present invention.

FIG. 6 shows a second embodiment of the cellular phone 200 in accordance with the present invention. By contrast to the cellular phone 100 of FIG. 2, the cellular phone 200 in the present embodiment has a second opening 203 formed on the shell 202 to communicate the rear space 224 to the environment for purposely flattening the resonance curve to prevent from the shrill voice.

Figure 7:
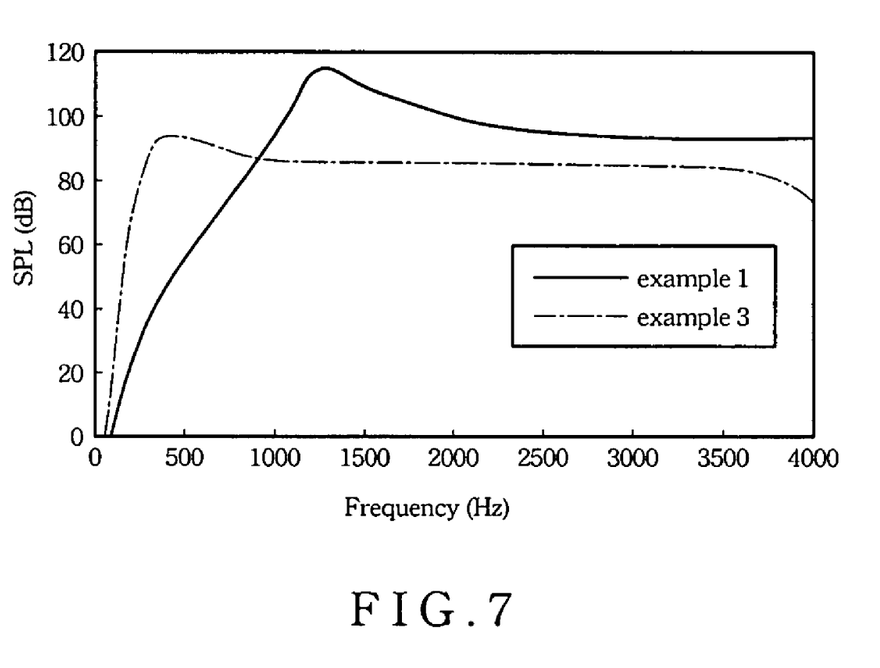
FIG. 7 shows simulation results of resonance curves of the cellular phone of FIG. 2 and FIG. 6.

FIG. 7 shows frequency resonance curves calculated according to the simulation results of the cellular phone 100 of FIG. 2 (denoted as example 1) and the cellular phone 200 of FIG. 6 (denoted as example 3). The solid-lined resonance curve of the cellular phone 100 of FIG. 2 is calculated by given a 40 mm$^2$ first opening 108, a 19 mm-diameter speaker 110, a 1.15 ml front space 122, a 2.04 ml rear space 124, a 1 mm thick circuit board 104, and a 1 mm thick shell 102. The center-lined resonance curve of the cellular phone 200 of FIG. 6 is calculated by given a 40 mm$^2$ first opening 208, a 19 mm-diameter speaker 210, a 1.15 ml front space 222, a 2.04 ml rear space 224, a 1 mm thick circuit board 204, a 1 mm thick shell 202, and a 240 mm$^2$ second opening 203.

It is noted that the second opening 203 of example 3 for communicating the environment and the rear space 224 does have a positive effect in flattening the severely vibration magnitudes of the resonance curve near the resonance frequency, such that the shrill voice can be substantially improved. At the same time, the second opening 203 can also push the peak of the resonance frequency to the lower frequency side so that the resonance effect in low frequency voices can be improved as well.

Figure 8:
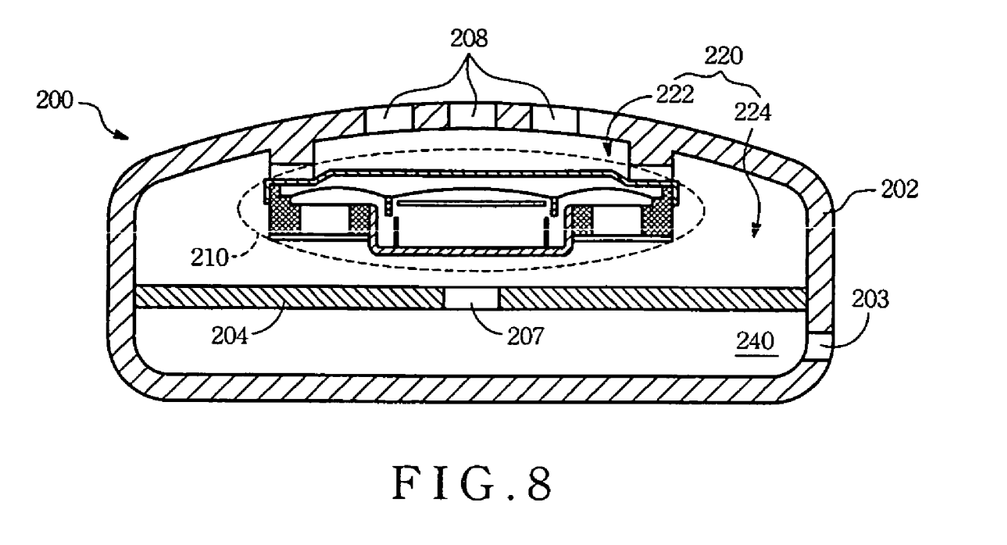
FIG. 8 depicts a schematic view of a third embodiment of the cellular phone in accordance with the present invention.

FIG. 8 shows a third embodiment of the cellular phone in accordance with the present invention. By contrast to the cellular phone of FIG. 4, the cellular phone in the present embodiment has a second opening 203 on the shell 202 to communicate the second acoustic room 224 to the environment in addition to a through hole 207 for communicating the first acoustic room 222 and the second acoustic room 224.

In is also noted that in the three embodiments mentioned above, there has only one second opening 203 or one through hole 207 formed in the cellular phone 200. However, the number of the through hole 207 may increase to fifteen with a total opening size ranged from 1 mm$^2$ to 500 mm$^2$ according to the need, and the number of the second opening 203 may increase to five with a total opening size ranged from 1 mm$^2$ to 500 mm$^2$ according to the need. In addition, the size of the cellular phone must be constrained to an acceptable and portable size. Therefore, the size of the first acoustic room 220 is ranged between 0.01 ml and 10 ml, the size of the second acoustic room 240 is ranged between 0.01 ml and 10 ml, the diameter of the speaker 210 is ranged between 10 mm and 25 mm, the thickness of the shell 202 is ranged between 0.5 mm and 4 mm, and the thickness of the circuit board 204 is ranged between 0.5 mm and 5 mm.

Figure 9:
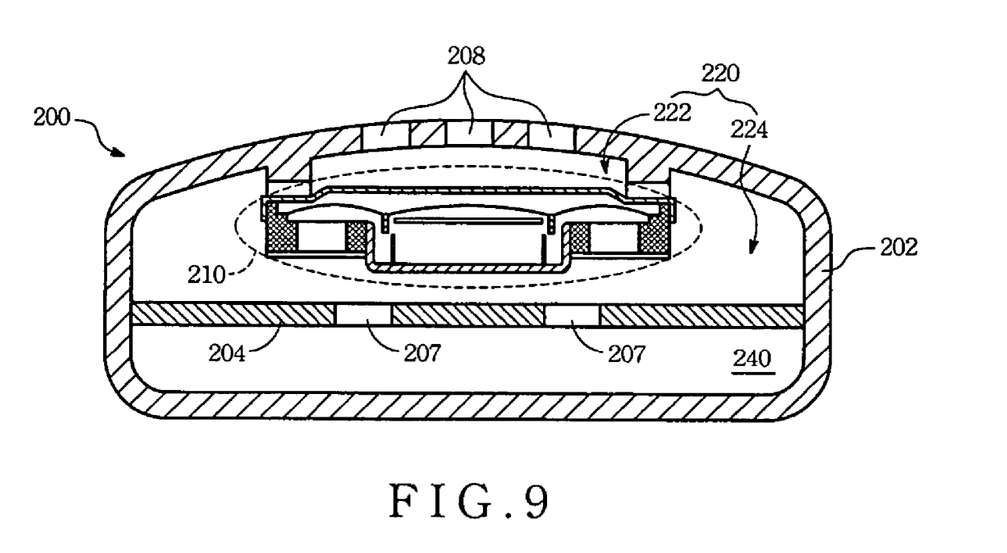
FIG. 9 depicts a schematic view of a fourth embodiment of the cellular phone in accordance with the present invention.

In a fourth embodiment of the cellular phone in accordance with the present invention as shown in FIG. 9, two separate through holes 207 are formed in the circuit board 204 to communicate the first acoustic room 220 and the second acoustic room 240 to result in an enlarged resonance chamber for improving the resonance effect in low frequency voices.

Figure 10:
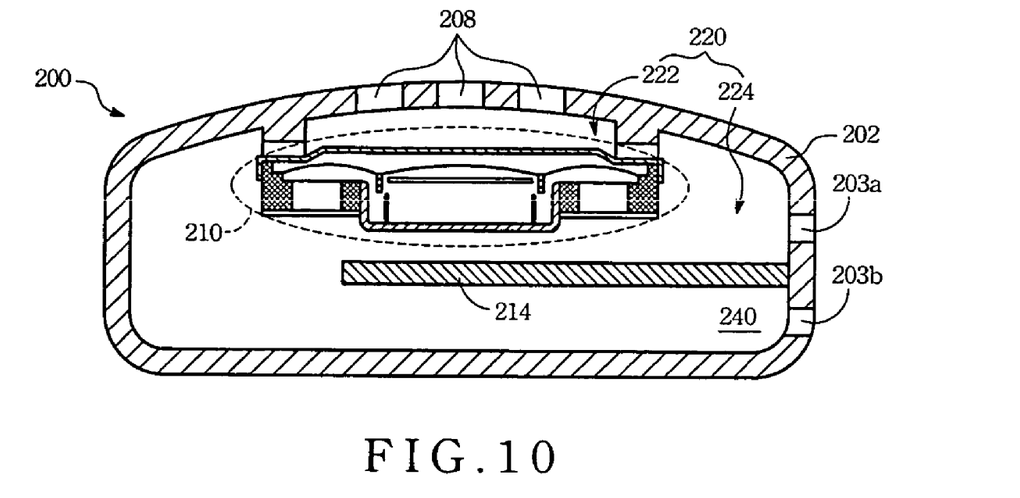
FIG. 10 depicts a schematic view of a fifth embodiment of the cellular phone in accordance with the present invention.

In a fifth embodiment of the cellular phone in accordance with the present invention as shown in FIG. 10, the width of the circuit board 204 is smaller than the width of the inner space enclosed by the shell 202, so that a gap (at the left hand side of the figure) can be formed between the circuit board 204 and a sidewall of shell 202 so as to result in a through hole to communicate the first acoustic room 220 and the second acoustic room 240. In addition, two second openings 203a and 203b are formed and aligned on the sidewall of the shell 202 so as to have both the first acoustic room 220 and the second acoustic room 240 communicate to the environment individually.

Figure 11:
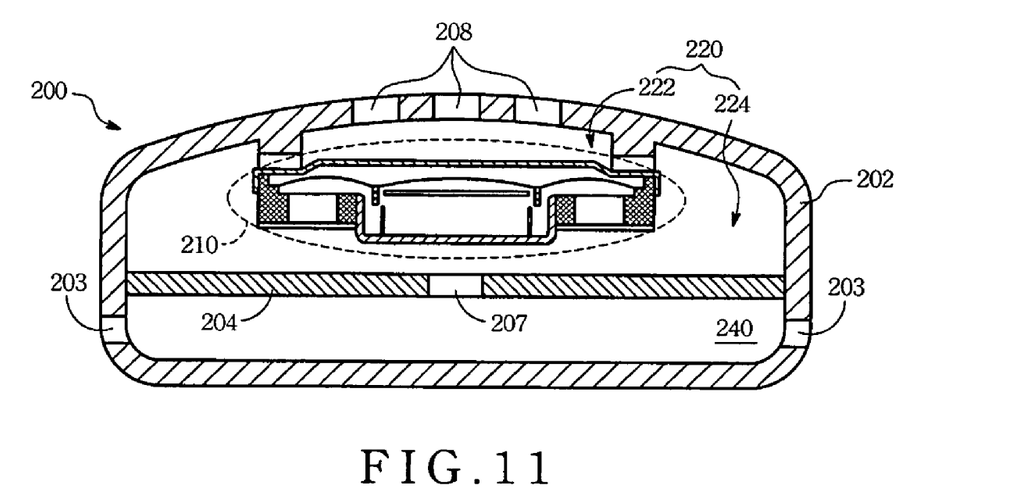
FIG. 11 depicts a schematic view of a sixth embodiment of the cellular phone in accordance with the present invention.

In a sixth embodiment of the cellular phone in accordance with the present invention as shown in FIG. 11, a through hole 207 is formed in the circuit board 204 to communicate the first acoustic room 220 and the second acoustic room 240, and two second openings 203 are formed on the opposite lateral sidewalls of the shell 202 to communicate the second acoustic room 240 to the environment.

In the present invention, the cellular phone is only a typical example of the present invention. The same structuring description in the aforesaid cellular phone can also be applied to any electronic device that has a structure resembling to the cellular phone described above.

By contrast to the prior art cellular phone of FIG. 2, the cellular phone in accordance with the present invention has the following advantages:

1. In the traditional cellular phone 100 of FIG. 2, only the first acoustic room 120 in front of the PCB 104 is used as the resonance chamber. Whereas, in the cellular phone 200 in accordance with the present invention, the second acoustic room 240 behind the PCB 204 can also be used as part of the resonance chamber. Therefore, an enlarged resonance chamber can be formed to improve the resonance effect in low frequency voices.

2. In the present invention, the second openings 203 are formed on the shell 202 to communicate the first acoustic room 220, the second acoustic room 240, or both to the environment. The environment may be regarded as an infinite large Helmholtz resonance chamber, so that the severely vibration magnitudes near the resonance frequency can be attenuated and the peak of the resonance curve can be flattened to avoid possible shrill voices.

3. The method of forming the through hole 207 and the second opening 203 in the cellular phone 200 to improve voice quality does not need a bigger cellular phone, and the portability of the cellular phone won't be sacrificed.

With the example and explanations above, the features and spirits of the invention will be hopefully well described. Those skilled in the art will readily observe that numerous modifications and alterations of the device may be made when retaining the teaching of the invention. Accordingly, the above disclosure should be construed as limited only by the metes and bounds of the appended claims.

What is claimed is:

1. A cellular telephone device comprising:
a shell, enclosing an inner space;
a print circuit board (PCB), disposed within the shell to divide the inner space into a first acoustic cavity formed in front of the PCB and a second acoustic cavity formed behind the PCB, having a through hole to communicate the first acoustic cavity and the second acoustic cavity; and a speaker, disposed within the first acoustic cavity and separated from the PCB to divide the first acoustic cavity into a front acoustic cavity in front of the speaker and a rear acoustic cavity between the speaker and the PCB;
wherein both the rear acoustic cavity and the second acoustic cavity formed behind the speaker are communicated with each other by the through hole.

2. The cellular telephone device of claim 1, wherein said shell has a first opening communicating the front space to the environment, and the first opening has a size ranged between 1 $mm^2$ and 100 $mm^2$.

3. The cellular telephone device of claim 1, wherein said shell has a second opening to connect the rear space to the environment.

4. The cellular telephone device of claim 3, wherein the second openings of the shell having a totally size ranged between 1 $mm^2$ and 500 $mm^2$.

5. The cellular telephone device of claim 3, wherein the number of the second openings of the shell is ranged between 1 and 15.

6. The cellular telephone device of claim 1, wherein said shell has a second opening to connect the second acoustic room to the environment.

7. The cellular telephone device of claim 6, wherein the second openings of the shell having a totally size ranged between 1 $mm^2$ and 500 $mm^2$.

8. The cellular telephone device of claim 6, wherein the number of the second openings of the shell is ranged between 1 and 15.

9. The cellular telephone device of claim 1, wherein said through hole has a size ranged between 1 $mm^2$ and 500 $mm^2$.

10. The cellular telephone device of claim 1, wherein the number of the through holes is ranged between 1 and 15.

11. The cellular telephone device of claim 1, wherein the volume of the first acoustic cavity is ranged between 0.01 ml and 10 ml.

12. The cellular telephone device of claim 1, wherein the volume of the second acoustic room is ranged between 0.01 ml and 10 ml.

13. The cellular telephone device of claim 1, wherein the speaker has a diameter of 10~25 mm.

14. The cellular telephone device of claim 1, wherein the shell has a thickness of 0.5~4 mm.

15. The cellular telephone device of claim 1, wherein the PCB has a thickness of 0.5~5 mm.

16. The cellular telephone device of claim 1, wherein said shell has a second opening to connect the rear acoustic cavity to the environment, so the air between the speaker and the print circuit board can flow in and out the shell through the second opening.

17. A cellular telephone device, comprising: a shell, having a first opening thereon, enclosing an inner space; a print circuit board (PCB), disposed within the inner space to divide the inner space into a first acoustic cavity and a second acoustic cavity, having thereof a through hole to communicate the first acoustic cavity and the second acoustic cavity and a sound generator, disposed within the first acoustic cavity and separated from the PCB, but electrically connecting to the PCB;

wherein at least a portion of the first acoustic cavity and the second acoustic cavity both formed behind the sound generator are communicated with each other by the through hole.

18. The cellular telephone device of claim 17, wherein the sound generator is disposed behind the first opening and in front of the through hole of the PCB.

19. The cellular telephone device of claim 17, wherein the through hole on the PCB aligns to a center of the sound generator.

20. The cellular telephone device of claim 17, wherein the shell has a second opening on a sidewall thereof to connect the first acoustic room to the environment.

21. The cellular telephone device of claim 17, wherein the shell has a second opening on the sidewall thereof to connect the second acoustic room to the environment.

22. The cellular telephone device of claim 17, wherein said shell has a second opening to connect the rear acoustic cavity to the environment, so the air between the speaker and the print circuit board can flow in and out the shell through the second opening.

\* \* \* \* \*